United States Patent
Moon et al.

(10) Patent No.: US 7,031,138 B2
(45) Date of Patent: Apr. 18, 2006

(54) FERROELECTRIC CAPACITOR AND PROCESS FOR ITS MANUFACTURE

(75) Inventors: Bum-Ki Moon, Tokyo-to (JP); Gerhard Beitel, Kanagawa-ken (JP); Osamu Arisumi, Kanagawa-ken (JP); Hiroshi Itokawa, Kanagawa-ken (JP)

(73) Assignees: Infineon Technologies AG, (DE); Kabushiki Kaisha Toshiba, (JP)

( * ) Notice: Subject to any disclaimer, the term of this patent is extended or adjusted under 35 U.S.C. 154(b) by 0 days.

(21) Appl. No.: 10/315,915

(22) Filed: Dec. 9, 2002

(65) Prior Publication Data

US 2004/0109280 A1    Jun. 10, 2004

(51) Int. Cl.
*H01G 4/20* (2006.01)
*H01G 4/06* (2006.01)

(52) U.S. Cl. ............... 361/312; 361/321.1; 257/306

(58) Field of Classification Search ........ 361/311–313, 361/320, 321.1, 321.2, 321.3, 321.4, 321.5; 257/301–312
See application file for complete search history.

(56) References Cited

U.S. PATENT DOCUMENTS

| 5,736,759 A | 4/1998 | Haushalter | |
| 5,913,117 A * | 6/1999 | Lee | 438/240 |
| 5,978,207 A * | 11/1999 | Anderson et al. | 361/311 |
| 6,153,898 A | 11/2000 | Watanabe et al. | |
| 6,229,166 B1 * | 5/2001 | Kim et al. | 257/295 |
| 2001/0025977 A1 * | 10/2001 | Hieda | 257/306 |

FOREIGN PATENT DOCUMENTS

| EP | 0618598 | 10/1994 |
| EP | 1069606 | 1/2001 |
| EP | 1150344 | 10/2001 |
| JP | 2002-198496 | * 7/2002 |

OTHER PUBLICATIONS

Chang L H et al: "Single and Multilayer Ferroelectric PbZrxTi1-xO3 (PZT) on BaTiO3" Thin Solid Films, Elsevier-Sequoia S.A. Lausanne, CH, vol. 303, No. 1-2, Jul. 15, 1997, pp. 94-100, XP004087618.
Othman M. B. et al. "A Novel Process For Alkoxide-Derived PZT Thin Films With Multi-Leeding Layers" Proceedings Of The IEEE International Symposium On Applications Of Ferroelectrics, XX, XX, vol. 2, Aug. 18, 1996, pp. 731-734, XP002070778.
International Search Report, mailing date May 10, 2004.

* cited by examiner

*Primary Examiner*—Eric W. Thomas
(74) *Attorney, Agent, or Firm*—Lerner, David, Littenberg, Krumholz & Mentlik, LLP

(57) ABSTRACT

In a capacitor and a method for its manufacture, a first electrode layer and a second electrode layer are formed such that a ferroelectric layer is situated between the first and second electrode layer. A first bilayer or multi-layer seed structure is formed between the ferroelectric layer and either the first electrode layer or the second electrode layer.

10 Claims, 3 Drawing Sheets

FIG 1
Prior Art
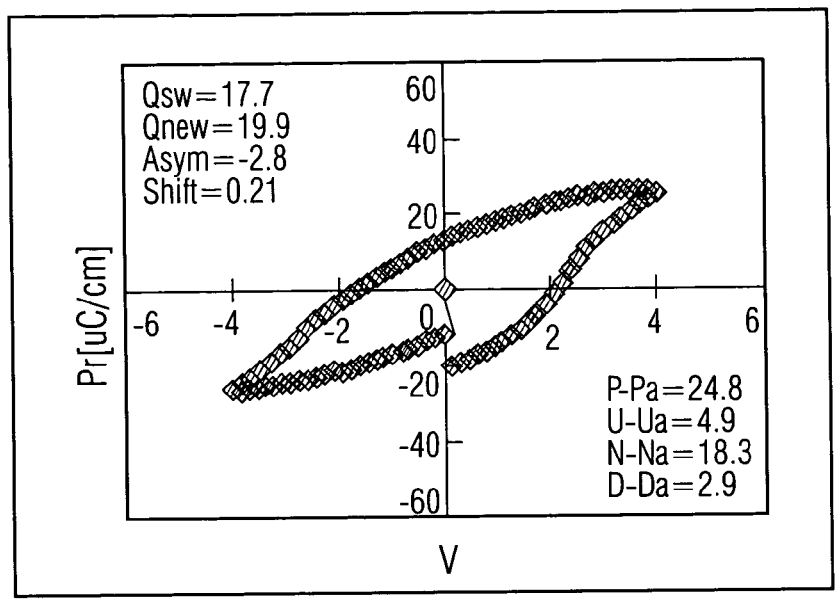
FIG 2A
FIG 2B
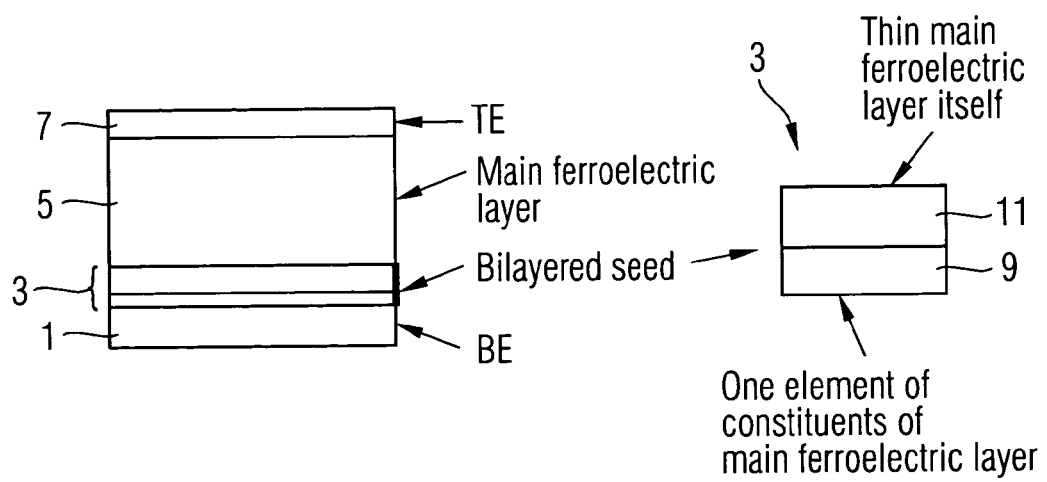

FERROELECTRIC CAPACITOR AND PROCESS FOR ITS MANUFACTURE

TECHNICAL FIELD

The present invention relates to a method of manufacturing capacitors, especially for ferroelectric applications including non-volatile memories known as FeRAM and for high-k dynamic random access memory (DRAM). It also relates to capacitors producible by this method.

BACKGROUND OF THE INVENTION

Ferroelectric capacitors have the advantage that they are able to switch quickly and can be fabricated on a single VLSI chip.

FeRAM's are advantageous in that they have the endurance of DRAM, the fast read/write times of SRAM and the non-volatility of flash.

Conventionally, an FeRAM is manufactured by depositing a ferroelectric film, such as lead zirconate titanate (PZT), strontium bismuth tantalum oxide (SBT), bismuth lanthanum titanium oxide (BLT) on a first, planar, electrode film, and forming a second electrode film over the ferroelectric layer. The second electrode layer and the ferroelectric film are then etched using a reactive ion etch method, after which the first electrode film is etched using a similar method. The result is a number of stacks comprising a first and second electrode film sandwiching the ferroelectric film.

In such conventional manufacturing methods, ferroelectric films are deposited on the electrode by changing deposition parameters with the aim of matching morphologies as close by as possible or any rate, promoting computability of adjacent layers. However, ferroelectric capacitors made by this method still tend to have poor characteristics, necessitating optimization of the fabrication method to minimise these problems. In order to improve ferroelectric properties, the introduction of a monolayered film prior to main ferroelectric film deposition has been reported in IFFF, 2002, Abstracts, 29B-FDI-5C, (2002), p. 49. It was shown that a $PbTiO_3$ seed layer can act as a good crystalline buffer for PZT.

However, because the seed layer's composition and ferroelectric properties are different from those of the main PZT layer, it is difficult to exclude formation of an interfacial layer which can cause undesirable properties due to parasitic ferroelectricity and capacitance at the interface. Actually, a $PbTiO_3$, seed layer can only form with tetragonal crystalline structure on the main PZT film. It can cause the enlargement of Vc (coercive voltage), and a large saturation voltage for ferroelectricity. In addition, further negative interface effects can be expected, since the fabrication method (Chemical Solution Deposition) for the $PbTiO_3$ seed-layer is different from that of main PZT layer formed by sputtering.

FIG. 1 shows the hysteresis characteristics of a PZT capacitor fabricated by the conventional method. The capacitor structure is TEOS-substrate/Ti/Ir/$IrO_2$/Pt/PZT/SRO/Pt. In this case, no seed layer was employed prior to deposition of PZT layer. The poor ferroelectric properties are due to the poor crystallinity and poor composition of the PZT films which were grown on the Pt bottom electrode (BE). The PZT film shows a depletion of Pb near the interface between the PZT film and the BE-Pt, since the element Pb can easily diffuse into the Pt bottom electrode during crystallization annealing. This strongly affects the crystallinity of the PZT film and degrades the electrical properties of PZT capacitors.

SUMMARY OF THE INVENTION

In order to control the composition at the interface and to obtain good ferroelectric properties of capacitor, the present invention utilises a bilayered or a multi-layered seed structure. This solves the aforementioned problems which occurs at the electrode interface and provides a good crystalline template, optimization of the total composition of the ferroelectric capacitor layer, including interface composition, and results in good electrical properties of the resultant capacitor.

A first aspect of the present invention provides a capacitor comprising,
  a first electrode layer;
  a second electrode layer;
  a ferroelectric layer situated between the first and second electrode layers; and
  a first bilayer or multi-layer seed structure situated between the ferroelectric layer and either the first electrode layer or the second electrode layer.

A second aspect of the present invention provides a method of forming a capacitor, said method comprising the steps of:
  forming a first electrode layer;
  forming a second electrode layer;
  forming a ferroelectric layer between the first and second electrode layers; and
  forming a first bilayer or multi-layer seed structure between the ferroelectric layer and either the first or second electrode layer.

For the avoidance of doubt, reference herein to pluralities of seed layers in the seed layer structure includes both separate layers and a compositional graduation within a single layer.

DESCRIPTION OF THE FIGURES

The present invention will now be better explained by the following description of preferred embodiments and with reference to the accompanying drawings in which:

FIG. 1 shows hysteresis curves of a PZT capacitor fabricated by the conventional method;

FIGS. 2A and 2B show a capacitor according to a first embodiment of the present invention and the bilayered seed structure thereof;

DETAILED DESCRIPTION OF THE INVENTION

Figure 3A:
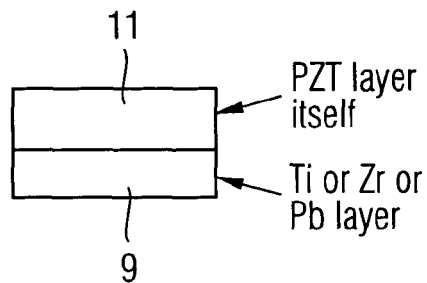
FIGS. 3A–3C show bilayered seed structures, respectively from PZT-, SBT- and BLT- capacitors.

FIG. 2B shows an example of a bilayered seed structure used in a capacitor as shown in FIG. 2A, according to the present invention. In this capacitor, a bottom electrode (BE) layer 1 has formed thereon, a bilayer seed structure 3 on which is formed a ferroelectric layer 5. A final top electrode (TE) layer 7 is formed on the ferroelectric layer 5. The bilayer seed structure is composed of a second layer 9 which comprises at least one constituent element of the main ferroelectric film, and a first layer 11 which is identical with the main ferroelectric layer 5. The first layer 11 may be identical with the main ferroelectric layer 5 in that the first layer 11 has either an identical composition or at least an identical elemental composition as the main ferroelectric layer 5. A proportion of an element in the first layer 11 may differ from a proportion of that same element in the ferroelectric layer 11. Materials of the BE and TE layers can be metal films (Pt, Ir, Ru, Pd, Rh and etc.) or conductive oxide films ($SrRuO_3$, $SrVO_3$, LaSrCoOx, $LiNbO_3$, $IrO_2$, $RuO_2$ and etc.) deposited by using PVD (physical vapor deposition), CVD (chemical vapor deposition), CSD (chemical solution deposition), spin-on or other known techniques.

For PZT ($Pb_x(Zr_yTi_{1-y})O_3$) ferroelectric capacitors, the second layer 9 can be a Ti or Zr or Pb film with 0.1–10 nm thickness, and the first layer can be a PZT layer itself with the thickness of 0.1–50 nm thickness, as shown in FIG. 3A. The composition can be controlled by the changing thickness of each first- and second-layer, which can control the interface composition of the resultant ferroelectric capacitors. The composition range of the bilayered seed layer can be in range of $Pb_x(Zr_yTi_{1-y})O_3$ (0<y<1, 0<x<1). Compared with the known method using $PbTiO_3$ monolayer as seed, in the present invention, the bilayered seed structure can have a wide range of possible compositions, which makes it possible to change the ferroelectric domain from tetragonal to rhombohederal. When a different composition is required at the interface, the kind of second layer material can be changed to, for example, Zr or Pb. The change of material and thickness of each layer in bilayer can optimize the interface status. For example, when the Ti-rich PZT interface layer is needed, the bilayer structure can be prepared by thick Ti and thin PZT with normal composition (wherein normal means the composition ration of Ti/Zr is approximately 60/40 to 70/30), which are crystallized. During crystallization annealing, mutual diffusion between the $1^{st}$ and $2^{nd}$ layers makes Ti-rich tetragonal PZT phases. Also, the composition of the interface layer can be controlled by changing the second layer's material, for example, by employing Pb or Zr instead of Ti. It is also possible to deposit a bilayered seed structure with composition which is graduated through the thickness of the layer, intentionally. This can sometimes avoid formation of trapping ions and/or electrons between the seed layer structure and main ferroelectric capacitor layer. After formation of the seed structure layers, a crystallization process can also be applied, for example, using an RTA (rapid thermal annealing) treatment, to create a crystalline structure from the amorphous phase. In the aforementioned known method, it is difficult to control the composition near the interface, since the seed layer structure has a composition which is fixed as that of $PbTiO_3$ film in which the seed layer can only form with the tetragonal structure of PZT main layer.

In FIGS. 3 and 4, like layers are denoted by the same reference numerals as used in FIGS. 2A and 2B.

As shown in FIG. 3A, the bilayer structure can have a second (lower) layer 9 of Ti, Zr or Pb.

Figure 3B:
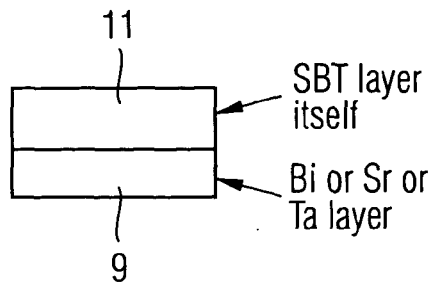
Figure 3C:
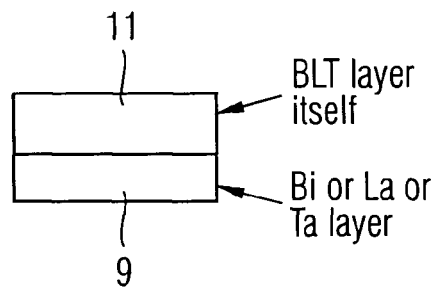

Referring to FIG. 3B, for SBT ($SrBi_2Ta_2O_9$) ferroelectric capacitors, the second layer 9 can be one of Bi, Sr or Ta film with 0.1–10 nm thickness, and first layer 11 can be a SBT layer itself with the thickness of 1–50 nm thickness. In the case of an SBT film, the diffusion of the Bi element is very severe during crystallization. For example, when Bi is chosen as the second layer, Bi can act as a supplier of volatile Bi, and, in turn, can promote crystallization of the first layer SBT film 11 during crystallization of this bilayered seed structure 3. The composition of Bi and the multi-layered seed structures can be controlled in the same way which is described for the bilayered seed for PZT capacitors. The composition range of the bilayered seed layer 3 can be one of in range of $Sr_aBi_bTa_cO_9$ (0<a<1, 0<b<1, 0<c<1).

For BLT ((BiLa)4Ti3O12) ferroelectric capacitors (FIG. 3C), the second layer can be a Bi or La or Ti film with 0.1–10 nm thickness, and first layer can be an BLT layer with the thickness of 1–50 nm thickness. The composition range of the bilayered seed layer can be one of in range of (BizLa1-z)4 TiwO12(0<z1, 0<w<1).

Figure 3D:
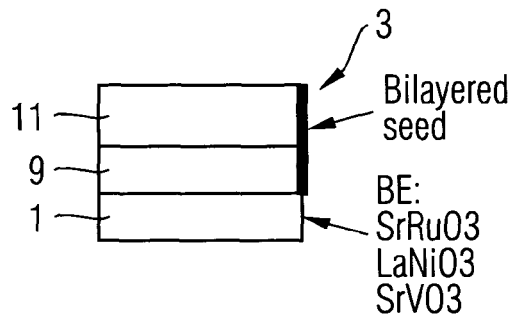
FIG. 3D shows a bilayered seed structure along with a bottom electrode using conductive perovskite oxide.

Crystallinity of the bilayered seed structure can be improved by using crystalline conductive oxide with a perovskite structure (e.g., SrRuO3, LaNiO3, SrVO3, etc) as a first electrode 1, as shown in FIG. 3D. This is because perovskite-type conductive oxide can provide good nucleation sites for perovskite ferroelectric layers such as PZT, SBT and BLT.

It is important to note that there are no thickness limitations for first and second layers of seed structures and the above thickness values are given by example only.

Figure 4A:
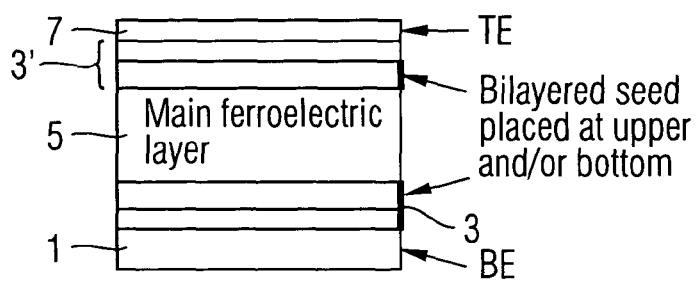
FIGS. 4A and 4B show alternative configurations for bilayered and multi-layered seed structures, respectively between the top electrode and/or the bottom electrode and the main ferroelectric layer.

When the composition needs to be controlled at the interface between the capacitor film and top electrode (TE), a bilayered seed structure 3' can be applied after formation of main ferroelectric film, as shown in FIG. 4A. By this procedure, the composition at the interface between ferroelectric film layer 5 and the TE layer 7 can be optimized with or without combination of applying a bilayered seed 3 at the interface between the BE layer 1 and the main ferroelectric film layer 5, which results in good electrical properties of the capacitor. Use of a bilayered seed structure (3 or 3') at the interface between the ferroelectric layer and the BE layer 1 or TE layer 7, controls the interface composition and gives a good crystalline template, giving improved electrical characteristics.

Figure 4B:
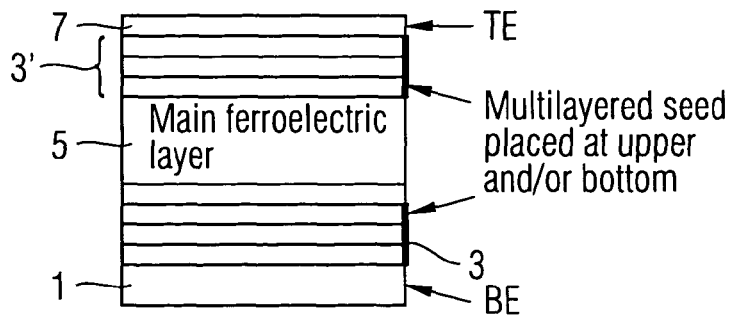

The composition can be further controlled by formation of multi-layered seed structure, which is composed of two or three layers which are stacked by, for example, Ti and Zr and Pb, on top of the PZT layer itself, as shown in FIG. 4B. Bilayered seed layers can be formed by using PVD (physical vapor deposition), CVD (chemical vapor deposition), CSD (chemical solution deposition), spin-on deposition or other known techniques.

Figure 5A:
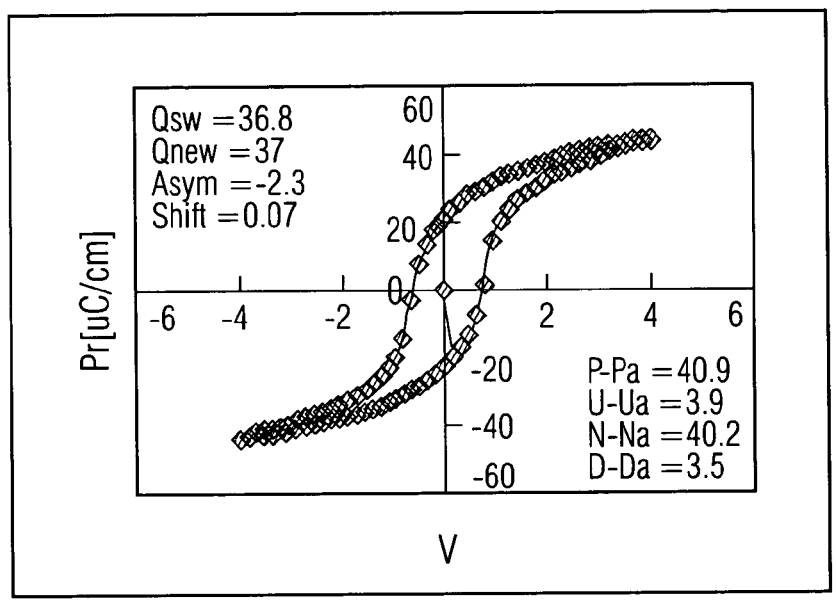
FIGS. 5A and 5B show curves illustrating electrical characteristics for a PZT capacitor according to the present invention.
Figure 5B:
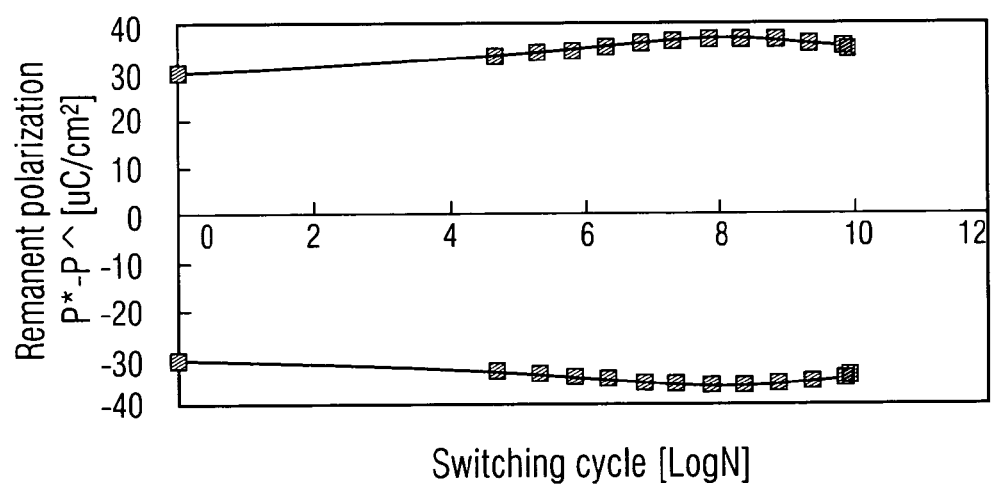

FIG. 5 shows the resulting electrical properties of a PZT capacitor with a bilayered seed structure of the present invention. The bilayered seed structure in this case is composed of a second layer of 2.5 nm-thick Ti film and a first layer of 7.5 nm-thickness PZT [$Pb(Zr_{40}Ti_{60})O_3$] film. After formation of the bilayered seed structure by sputtering, the bilayer was annealed at 650° C. for 30 sec in $O_2$ ambient using RTA (rapid thermal process). Compared the conventional (without bilayered seed) method (cf. FIG. 1), the PZT capacitor shows hysteresis characteristics with good squareness (FIG. 5A). The capacitor structure was TEOS-substrate/Ti/I/IrO2/Pt (10 nm)/bilayered seed/PZT/SRO (10 nm)/Pt(50 nm). The Vc of the capacitor is fairly low and saturation property is very good, which are parameters attributed to good PZT quality including good interface properties. Furthermore, this capacitor shows fatigue free characteristics, even after fatigue test of $10^{10}$ cycles (FIG. 5B).

The invention claimed is:
1. A capacitor comprising,
a first electrode layer;
a second electrode layer;
a ferroelectric layer situated between the first and second electrode layers;

a first multi-layer seed structure situated between the ferroelectric layer and one of the first electrode layer and the second electrode layer, the first multi-layer seed structure comprising:
a first seed layer in contact with the ferroelectric layer and having a composition that is substantially identical to that of the ferroelectric layer, and
a second seed layer in contact with the one of the first electrode layer and the second electrode layer and having a composition that is different than that of the ferroelectric layer but which includes at least one component of the ferroelectric layer; and
a second multi-layer seed structure situated between the ferroelectric layer and another of the first electrode layer and the second electrode layer.

2. The capacitor of claim 1, wherein the composition of the first multi-layer seed structure varies between the ferroelectric layer and the one of the first electrode layer and the second electrode layer according to a composition gradient.

3. The capacitor of claim 1, wherein the one of the first electrode layer and the second electrode layer includes a crystalline conductive oxide for improving the crystallinity of the first multi-layer seed structure.

4. The capacitor of claim 1, wherein the ferroelectric layer includes a material selected from the group consisting of PZT, SBT, and BLT.

5. The capacitor of claim 4, wherein the second seed layer includes an element selected from the group consisting of Ti, Zr, Pb, Bi, La, Ta, and Sr.

6. The capacitor of claim 1, wherein the second multi-layer seed structure includes:
a first seed layer in contact with the ferroelectric layer and having a composition that is substantially identical to that of the ferroelectric layer, and
a second seed layer in contact with the another of the first electrode layer and the second electrode layer and having a composition that is different than that of the ferroelectric layer but which includes at least one component of the ferroelectric layer.

7. The capacitor of claim 6, wherein the ferroelectric layer includes a material selected from the group consisting of PZT, SBT, and BLT.

8. The capacitor of claim 7, wherein the second seed layer of the second multi-layer seed structure includes an element selected from the group consisting of Ti, Zr, Pb, Bi, La, Ta, and Sr.

9. The capacitor of claim 1, wherein the composition of the second multi-layer seed structure varies between the ferroelectric layer and the another of the first electrode layer and the second electrode layer according to a composition gradient.

10. The capacitor of claim 1, wherein the another of the first electrode layer and the second electrode layer includes a crystalline conductive oxide for improving the crystallinity of the first multi-layer seed structure.

* * * * *